(12) United States Patent
Kim et al.

(10) Patent No.: US 7,510,663 B2
(45) Date of Patent: Mar. 31, 2009

(54) METHOD FOR MANUFACTURING ORGANIC MOLECULAR DEVICE

(75) Inventors: Seong Jin Kim, Daejon-Shi (KR); Hyoyoung Lee, Daejon-Shi (KR); Mun Seok Jeong, Jeollabuk-do (KR); Tae Hyoung Zyung, Daejon-Shi (KR); Do Hyun Kim, Daejon-Shi (KR); Eun Ju Lee, Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 571 days.

(21) Appl. No.: 10/727,900

(22) Filed: Dec. 5, 2003

(65) Prior Publication Data

US 2005/0051768 A1    Mar. 10, 2005

(30) Foreign Application Priority Data

Sep. 6, 2003    (KR) .................... 10-2003-0062416

(51) Int. Cl.
*C23F 1/00*    (2006.01)
(52) U.S. Cl. ........................................................ 216/2
(58) Field of Classification Search ............ 219/121.19, 219/121.2, 121.68, 121.69; 204/485; 205/121, 205/122; 216/2, 39, 40, 56, 66, 72; 313/504; 977/DIG. 1; 438/48, 99
See application file for complete search history.

(56) References Cited

U.S. PATENT DOCUMENTS

| | | | |
|---|---|---|---|
| 5,277,068 A * | 1/1994 | Fukiura et al. ................ 73/724 |
| 5,409,783 A * | 4/1995 | Tang et al. ................... 428/690 |
| 5,497,000 A * | 3/1996 | Tao et al. ..................... 250/307 |
| 5,587,128 A * | 12/1996 | Wilding et al. ................ 422/50 |
| 5,658,698 A * | 8/1997 | Yagi et al. ..................... 430/11 |
| 6,025,202 A * | 2/2000 | Natan .......................... 436/104 |
| 6,034,414 A * | 3/2000 | Lin ............................. 257/600 |

(Continued)

FOREIGN PATENT DOCUMENTS

JP    2002-226997    8/2002

(Continued)

OTHER PUBLICATIONS

Yong Chen, et al; "*Nanoscale molecular-switch devices fabricated by imprint lithography*"; Applied Physics Letters; vol. 83, No. 10; Mar. 10, 2003; pp. 1610-1612.

(Continued)

*Primary Examiner*—Samuel M Heinrich
(74) *Attorney, Agent, or Firm*—Lowe Hauptman Ham & Berner, LLP

(57) ABSTRACT

Disclosed is a method for manufacturing a conductive organic thin film device. An air-bridge type of an upper electrode is formed over a lower electrode by using a sacrificial layer and then a gap having a thickness of several nano meter is formed in a part at which the upper electrode and the lower electrode intersect by removing the sacrificial layer. The conductive organic molecules are uniformly adsorbed between the upper electrode and the lower electrode of the nano gap. Adsorption extent of the conductive organic molecules is confirmed by observing a current flowing through the upper and lower electrodes when the conductive organic molecules are adsorbed. Thus, reproducibility of a manufacturing process is improved and mass production is facilitated by adoption of a standardized process.

9 Claims, 3 Drawing Sheets

U.S. PATENT DOCUMENTS

| | | | |
|---|---|---|---|
| 6,180,536 B1 * | 1/2001 | Chong et al. | 438/745 |
| 6,225,239 B1 * | 5/2001 | Ohno et al. | 438/780 |
| 6,242,264 B1 * | 6/2001 | Natan et al. | 436/171 |
| 6,458,600 B1 * | 10/2002 | Mirsky et al. | 436/518 |
| 6,517,401 B1 * | 2/2003 | Ogawa et al. | 445/24 |
| 6,586,763 B2 * | 7/2003 | Marks et al. | 257/40 |
| 6,661,024 B1 * | 12/2003 | Zhang et al. | 257/40 |
| 6,770,190 B1 * | 8/2004 | Milanovski et al. | 205/777.5 |
| 6,878,539 B1 * | 4/2005 | Fritzsche et al. | 435/287.2 |
| 6,881,315 B2 * | 4/2005 | Iida et al. | 204/600 |
| 7,074,519 B2 * | 7/2006 | Kuhr et al. | 429/149 |
| 2002/0134426 A1 * | 9/2002 | Chiba et al. | 136/263 |
| 2003/0040173 A1 * | 2/2003 | Fonash et al. | 438/622 |
| 2003/0087277 A1 * | 5/2003 | Fritzsche et al. | 435/6 |
| 2003/0180627 A1 * | 9/2003 | Lavallee et al. | 430/5 |
| 2003/0211649 A1 * | 11/2003 | Hirai et al. | 438/48 |
| 2004/0113098 A1 * | 6/2004 | Vardeny et al. | 250/492.2 |
| 2004/0161708 A1 * | 8/2004 | Nagase et al. | 430/313 |
| 2005/0145839 A1 * | 7/2005 | Yamamoto et al. | 257/40 |

FOREIGN PATENT DOCUMENTS

| | | |
|---|---|---|
| JP | 2002-309013 | 10/2002 |
| JP | 02005115172 A * | 4/2005 |

OTHER PUBLICATIONS

C. Zhou, et al; *"Nanoscale metal/self-assembled monolayer/metal heterostructures"*; Applied Physics Letters; Vo. 71, No. 5; Aug. 4, 1997; pp. 611-613.

* cited by examiner

FIG. 4
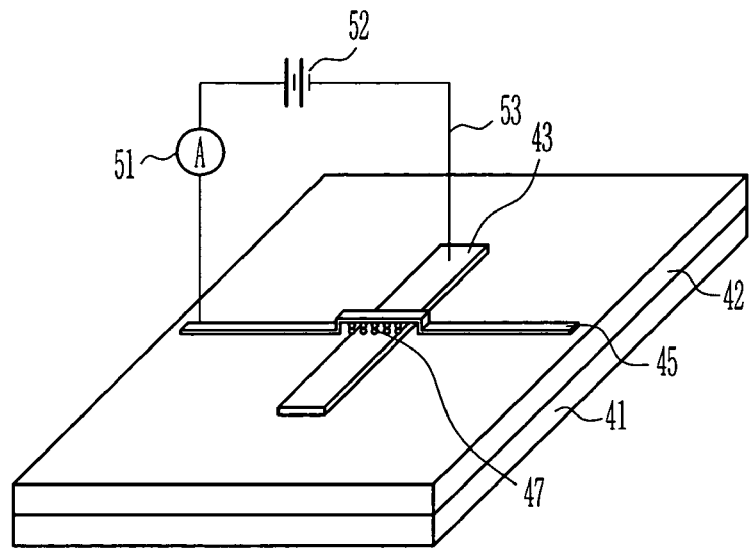
FIG. 5A
FIG. 5B
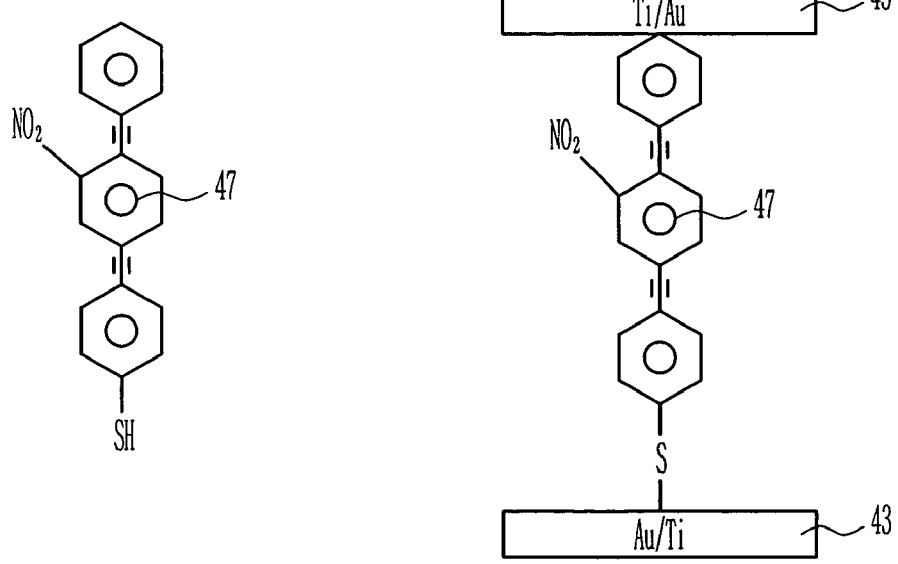

METHOD FOR MANUFACTURING ORGANIC MOLECULAR DEVICE

CROSS-REFERENCE TO RELATED APPLICATION

This application claims the benefit of Korean Patent Application No. 2003-62416 filed on Sep. 6, 2003, the disclosure of which is hereby incorporated herein by reference in its entirety.

BACKGROUND OF THE INVENTION

1. Field of the Invention

The present invention relates to a method for manufacturing a conductive organic molecular device using organic molecules with a conductivity property and, more particularly, to a method for manufacturing a nano-scale organic molecular device capable of improving reproducibility of a manufacturing process.

2. Description of the Related Art

Generally, a conductive organic molecular device that uses organic molecules with a conductive property (or a conductive organic semiconductor) is manufactured in various methods. As an instance, there is a method using self-assembly monolayer as an active layer [see Molecular Nanoelectronics, Chapter M, edited by American Scientific Publishers]. In this method, an insulating film SiN is formed on an upper and lower surface of a silicon (Si) substrate and then a hole with several micrometers diameter is formed in a lower portion of the substrate and the lower insulating film SiN. Also, a nano-sized pore is formed in the upper insulating film SiN at the top of the hole with an electron beam etching technique. The nano-sized pore takes a bowl shape with the opening at the upper edge. Next, a lower electrode is formed by evaporating a metal from the bottom side to fill the nano-sized pore and the substrate is immersed into a solution in which conductive organic molecules are dissolved. At this time, the conductive organic molecules are self assemble onto an exposed surface of lower electrode in the pore and form a highly ordered monolayer. After the conductive organic thin film is formed on the lower electrode, an upper electrode is formed on the conductive organic thin film. At this time, the upper electrode is formed by a method using a shadow mask or an ion milling method of depositing a conductive material on an entire substrate and then leaving only a portion of the conductive material [see Nano-scale molecular-switch devices manufactured by imprint lithography, Applied Physics Letters, Vol. 82-10, 2003 1610].

In the related art as described above, it is required to use dry etching equipment such as chemical reactive ion etching (RIE or ICP/RIE) equipment in order to form the nano-sized pore. Further, in order to form a clear pore, the upper insulating film has to be ion-etched for enough time. At this time, a residue such as a polymer may remain in the pore, which disturbs adsorption of a good quality of conductive organic molecules onto the lower electrode. In particular, because most of the conductive organic molecules adsorbed onto the lower electrode are damaged by acetone, solvent or the like, a photo-etching process cannot be implemented using a photoresist that includes the acetone or the solvent, and the like, after the conductive organic molecules are adsorbed onto the lower electrode.

SUMMARY OF THE INVENTION

It is, therefore, an object of the present invention to provide a method for manufacturing an organic molecular device that is capable of overcoming the aforementioned problem by forming an air-bridge type of an upper electrode over a lower electrode using a sacrificial layer, and then forming a gap of approximately several nano meter in a part at which the upper electrode and the lower electrode intersect by removing the sacrificial layer, and uniformly adsorbing the conductive organic molecules between the upper electrode and the lower electrode of the nano gap.

The present invention for achieving the object is characterized in that it comprises the following steps of: forming a lower electrode on a substrate; forming a predetermined size of a sacrificial layer pattern on the substrate including the lower electrode; forming an upper electrode on the substrate including the sacrificial layer pattern; removing the sacrificial layer so that a nano gap is formed between the lower electrode and upper electrode; and adsorbing conductive organic molecules between the upper electrode and the lower electrode of the nano gap It is characterized in that the lower and upper electrodes are formed by the following steps of: forming a polymer pattern using an electron beam etching technique; removing metal on the polymer pattern in a liftoff process after depositing the metal on the entire upper surface; and removing the polymer pattern.

It is characterized in that the sacrificial layer pattern is formed in a part at which the lower and upper electrodes intersect, and is formed of an organic material, an oxide film or metal, which has a selective etching property with the substrate, the sacrificial layer pattern being formed in a nanometer thickness.

It is characterized in that the nano gap is formed so that vertical and horizontal distances thereof are asymmetric, the horizontal distance being larger than the vertical distance.

It is characterized in that the conductive organic molecules are adsorbed while the substrate is immersed in a solution in which the conductive organic molecules are dissolved, an electric field is applied between the lower electrode and the upper electrode on the substrate, and the solution is stirred or heated.

It is characterized in that when the conductive organic molecules are adsorbed, a current flowing through the lower electrode and the upper electrode is sensed so that whether and how much to adsorb is monitored.

It is characterized in that it further includes a step of passivating an exterior with an insulating film after adsorbing the conductive organic molecules.

BRIEF DESCRIPTION OF THE DRAWINGS

FIG. 4 is a diagram for illustrating a circuit configured for evaluating a property of a device onto which conductive organic molecules have been adsorbed;

FIG. 5A is a chemical structure view of conductive organic molecules dissolved in a solution; and FIG. 5B is a structure view showing an arrangement of conductive organic molecules adsorbed between an upper electrode and a lower electrode.

DESCRIPTION OF THE PREFERRED EMBODIMENTS

Hereinafter, the most preferred embodiment of the present invention will be described in detail with reference to the accompanying drawings so that an ordinary skilled person in the art implements the present invention easily.

FIGS. 1A to 1F are cross-sectional views for explaining a method for manufacturing an organic molecular device according to an embodiment of the present invention.

Figure 1A:
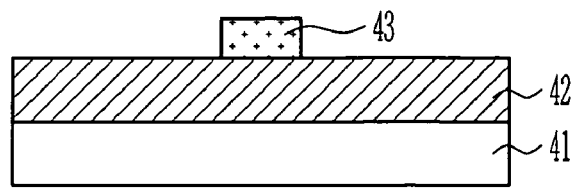
FIGS. 1A to 1F are cross-sectional views for explaining a method for manufacturing an organic molecular device according to an embodiment of the present invention.

Referring to FIG. 1A, in order to prevent a leakage current, a high resistive substrate 41 composed of an insulating material such as silicon (Si), GaAs, glass, and sapphire ($Al_2O_3$) is used. Alternatively, an insulating film 42 is formed of a material such as $SiO_2$, SiN, BCB (benzocyclobutenne), and SOG (silicon-on-glass) on the substrate 41. An electrode pad (not shown) is formed on the insulating film 42 in a peripheral area using a photo etching technique and then the entire upper surface is coated with a polymer (PMMA; not shown). Also, a pattern having a line width of 50 nm is formed using an electron beam etching technique to expose a portion of the insulating film 42. Through the portion of the insulating film 42 a lower electrode will be connected to the electrode pad. A Metal layer is deposited on the entire upper surface and then the metal on the polymer pattern is removed in a liftoff process so that the lower electrode 43 is formed on the insulating film 42 of the exposed portion. Thereafter, the polymer pattern is removed.

Because a current level of the organic molecular device using conductive organic molecules such as biphenyl thiols and LB (Langmuir-Blodgett) film is of approximately several nA or pA, it is very important to prevent the leakage current into the substrate 41 in order to obtain an accurate property of the device. Thus, preferably, the substrate 41 with a high resistance is selected, or if it is not available, an insulating film such as BCB and SOG is deposited on the substrate 41 in a great thickness to increase side resistance.

Figure 1B:
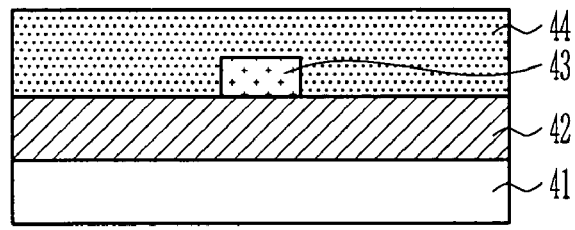

Referring to FIG. 1B, on the entire upper surface, a sacrificial layer 44 is formed of an organic material, an oxide film, an inorganic thin film, metal and the like, each having a selective etching property with the insulating film 42.

It is important that the sacrificial layer 44 for forming a nano gap between the lower electrode 43 and the upper electrode 45 is accurately deposited in a approximate nano meter thickness. Because accurate adjustment of the nano meter thickness is difficult when PECVD (plasma enhanced chemical vapor deposition) equipment is used, a technique development for such adjustment is necessary. However, preferably, a method for depositing a plurality of metal thin films having a selective etching property, such as Ti, Pt and Au, will be useful. Further, inorganic material thin film deposition equipments such as molecular beam epitaxy (MBE) equipment, metal organic chemical vapor epitaxy (MOCVD) equipment and the like have an advantage which can accurately adjust a thickness of the thin film as less as a monolayer. Accordingly, they will be advantageous to form the sacrificial layer 44 in a sophisticated thickness.

Figure 1C:
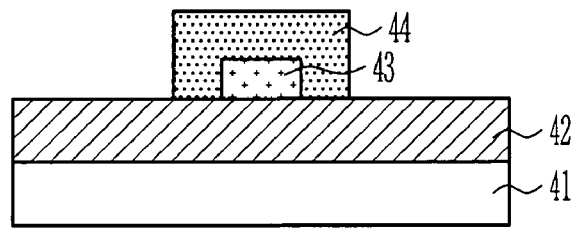

Referring to FIG. 1C, the sacrificial layer 44 is remained only in a predetermined area including the lower electrode 43 by using a photo etching technique. At this time, the sacrificial layer pattern 44 remains in the form of surrounding the lower electrode 43.

Figure 1D:
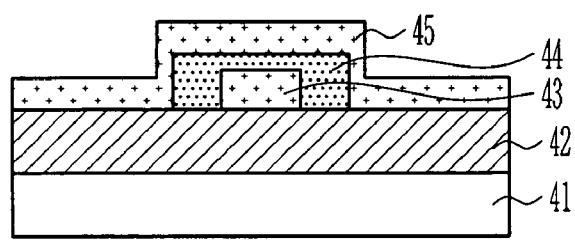

Referring to FIG. 1D, the entire upper surface is coated with a polymer (PMMA; not shown), and then a polymer pattern with a line width of 50 nm is formed by an electron beam etching technique to expose the sacrificial layer 44 and the insulating film 42 of a part on which an upper electrode is formed. Next, Metal 45 for the upper electrode is deposited on the entire upper surface and then metal on the polymer pattern is removed in a liftoff process such that the upper electrode 45 is formed on the sacrificial layer 44 and the insulating film 42 of the exposed portion. Thereafter, the polymer pattern is removed. At this time, the upper electrode 45 is formed in such a manner that the upper electrode 45 intersects the lower electrode 43.

Figure 1E:
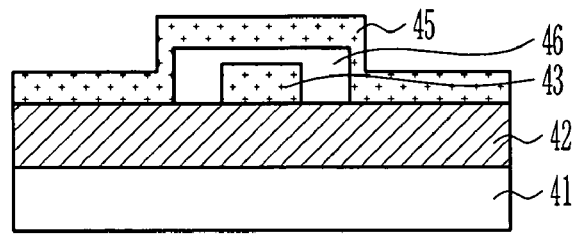

Referring to FIG. 1E, in order to form a nano gap 46 between the upper electrode 45 and the lower electrode 43, the sacrificial layer 44 is removed. The upper electrode 45 is remained in an air-bridge type by removing the sacrificial layer 44.

The sacrificial layer 44 is removed by a selective etching solution (buffer oxide etchant). If the substrate 41 is immersed in the selective etching solution, only the sacrificial layer 44 is selectively etched. At this time, a vertical distance between the lower electrode 43 and the upper electrode 45, i.e., a thickness of the nano gap 46 and a horizontal distance between the upper electrode 45 and the lower electrode 43 are sufficiently secured so that the current flows only in a vertical direction or the current does not flow into sides. Preferably, the nano gap 46 is formed such that the vertical distance and the horizontal distance thereof are asymmetric to each other, with the horizontal distance being larger than the vertical distance.

Figure 1F:
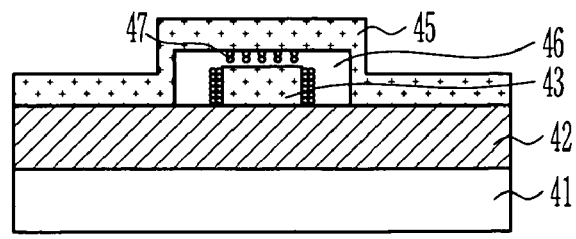

Referring to FIG. 1F, if the conductive organic molecule 47 is adsorbed between the lower electrode 43 and the upper electrode 45 exposed through the nano gap 46, fabrication of the conductive organic molecular device is completed. The present invention uses an adsorption device configured as in FIG. 2 for adsorbing the conductive organic molecule 47.

Figure 2:
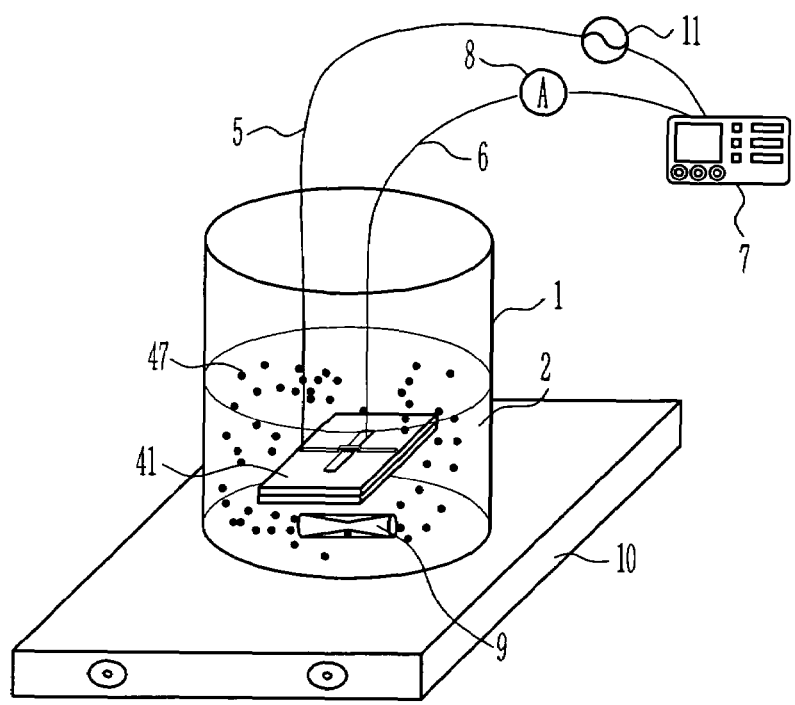
FIG. 2 is a construction diagram of a conductive organic molecule adsorption device used in the present invention.

FIG. 2 illustrates a construction of a device for conductive organic molecule adsorption. A Teflon receptacle or a beaker 1 is placed on a plate 10 capable of being heated and stirred. A solution 2 containing the dissolved conductive organic molecules 47 is filled in the beaker 1, a Teflon-coated magnetic bar 9 is disposed at the bottom of the beaker 1, and the substrate 41 having the formed nano gap 46 is positioned over the magnetic bar 9.

After each of wire cables 5 and 6 is connected to the upper electrode 45 and the lower electrode 43 formed on the substrate 41, power is applied to the wire cables 5 and 6 from a DC/AC power supply 7. A current meter 8 and an alternating current generator 11 are connected to the wire cables 5 and 6.

As described above, the substrate 41 having the formed nano gap 46 is placed in the beaker 1 containing the dissolved conductive organic molecules 47 therein. In order to adsorb the conductive organic molecules 47 onto the lower electrode 43 and the upper electrode 45 between the nano gap 46, a method of adsorbing the conductive organic molecules 47 only in a self-organized phenomena without applying an electric field, a method of adsorbing the conductive organic molecules 47 by applying the electric field between the lower electrode 43 and the upper electrode 45, and the like may be used in combination. In case of the former, one end of the conductive organic molecule 47 is preferentially adsorbed to the electrode selectively according to the type of the electrode. If the one end is chemically adsorbed onto one electrode surface, the other end of the molecule is arranged to the surface of the other electrode, but at this time, the arrangement direction of the molecule may be not vertical to both electrodes 43 and 45. However, in case of the latter, because the electric field is applied between the nano gap 46, the lower electrode 43 acts as a cathode electrode or an anode electrode and the upper electrode 45 acts as the anode electrode or the cathode electrode so that the electric field between two electrodes 43 and 45 is applied. The molecules move with orientations by the electric field effect. Thus, because arrangement of the molecules is adjusted by the electric field, it is possible to determine whether either end of the molecule contacts with the upper electrode 45 or the lower electrode 43, as well as to form a vertical arrangement of the conductive organic molecule 47.

Preferably, the current can be applied as a direct or alternating current according to an adsorption condition of the conductive organic molecule. Further, in order to secure adsorption uniformity of the organic molecules, the solution 2 containing the dissolved conductive organic molecules 47 can be stirred by driving the plate 10 while the organic molecules are adsorbed. Heat may be applied to the solution 2 by heating the plate 10 according to cases. In particular, in case of observing the current flow between two electrodes using the current meter 8 after applying the electric field, it is possible to monitor whether the conductive organic molecule 47 is adsorbed and how much the conductive organic molecule 47 is adsorbed, thereby maintaining reproducibility upon fabrication of the conductive organic molecular device.

Figure 3:
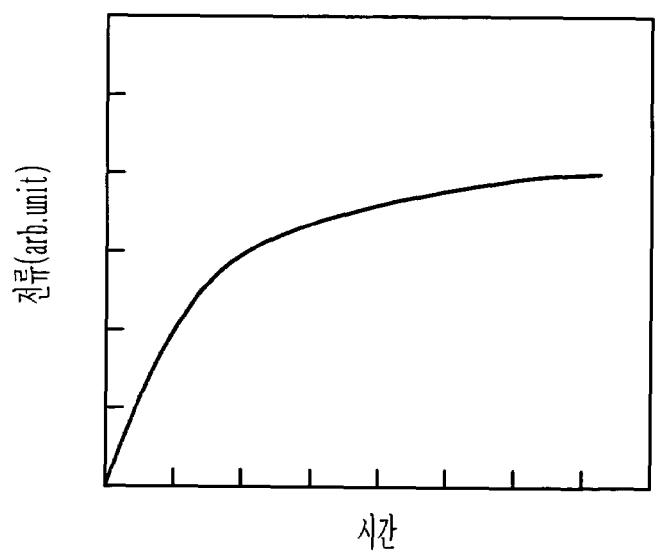
FIG. 3 is a graph representing current change expected while conductive organic molecules are adsorbed.

FIG. 3 is a graph representing current change expected while the conductive organic molecules 47 are adsorbed. There is no current flow through the upper electrode 45 and the lower electrode 43 because there is no medium for flowing the current before the conductive organic molecules 47 are adsorbed, which indicates a low current value, while when the conductive organic molecules 47 begin to be adsorbed between the upper electrode 45 and the lower electrode 43, a channel of the conductive organic molecules 47 is formed between the upper electrode 45 and the lower electrode 43, resulting in an increased current value. Then, when adsorption reaction of the organic molecule 47 is stopped, it indicates a saturation current.

FIG. 4 shows an example of a circuit configured for evaluating a property of the device for which the adsorption of the conductive organic molecules 47 has been completed. A wire cable 53 is connected between the lower electrode 43 and the upper electrode 45 formed on the insulating film 42, and a current flows through the wire cable 53 by means of a power supply 52. The current flowing through a current meter 51 may be measured or the property of the device may be evaluated. Accordingly, a diode property and a quantum effect property may be observed according to a type of the conductive organic molecules 47. In particular, it is also applicable to a large-scale memory device, and a logic circuit device, an analog circuit device by implementing the conductive organic molecular device of the nano size.

FIG. 5A shows a chemical structure of nitro-compound conductive organic molecules 47, which is dissolved into a THF (tetrahydrofuran) solution, and FIG. 5B shows an arrangement of the conductive organic molecule 47 adsorbed onto the upper electrode 45 and the lower electrode 43. As shown in FIGS. 5A and 5B, one end of the conductive organic molecule 47 is chemically contacted to the lower electrode 43 and the other end is physically contacted to the upper electrode 45. At this time, only if the conductive organic molecule 47 is appropriately selected, both ends of the organic molecule 47 can contact chemically.

Preferably, in order to chemically contact both ends of the conductive organic molecule 47 to the upper electrode 45 and the lower electrode 43, the nano gap 46 formed in the part at which the upper electrode 45 and the lower electrode 43 intersect has to be accurately formed in the same thickness as the length of the conductive organic molecule 47. Even when the thickness of the nano gap 46 could not be accurately adjusted by the length of the conductive organic molecule 47, only if a thickness of the metal or a type of the metal thin film is appropriately selected, the upper electrode 45 is bent downward due to flexibility or stress of the metal, such that the conductive organic thin film 47 contacts with the upper electrode 45. Further, in order to improve reliability of the device, if the adsorption of the conductive organic thin film 47 between the upper electrode 45 and the lower electrode 43 is completed, an exterior is passivated by an insulating film such as $SiO_X$, $SiN_X$ and the like, thereby more closely adhering the upper electrode 45 to the organic molecule 47.

According to the present invention as described above, an air-bridge type of the upper electrode is formed over the lower electrode using the sacrificial layer and then the gap of approximately several nano meter is formed in the part at which the upper electrode and the lower electrode intersect by removing the sacrificial layer, and the conductive organic molecules are uniformly adsorbed between the upper electrode and the lower electrode of the nano gap. Adsorption extent of the conductive organic molecule can be easily confirmed by observing the current flowing through the upper and lower electrodes while the conductive organic molecules are adsorbed, thereby easily improving reproducibility of the process and facilitating mass production by adoption of a standardized process.

What is claimed is:

1. A method for manufacturing an organic molecular device comprising the steps of:
   a) providing a substrate of a resistive insulating material having an insulating layer formed on an upper surface and forming a lower electrode on the insulating layer;
   b) forming a predetermined size of a sacrificial layer pattern on an entire upper surface of the substrate including the lower electrode and the insulating layer;
   c) using a photo etching technique to remove a portion of the sacrificial layer excluding a predetermined area covering the lower electrode so that a remaining portion of the sacrificial layer surrounds—the lower electrode;
   d) covering the entire remaining surface from step c including the remaining portion of the sacrificial layer surrounding the lower electrode with a polymer and forming a polymer pattern with a line width of 50 nm using electron beam etching to expose the sacrificial layer and the substrate on which the lower electrode is formed;
   e) forming an upper electrode by depositing metal on an entire-upper surface from step d) and removing metal on the polymer pattern by a lift-off process so that an upper electrode is formed on the remaining portion of the sacrificial layer so as to have an air-bridge configuration and to surround upper and side surfaces of the lower electrode and to be on an exposed portion of the insulating layer;
   f) removing the sacrificial layer so that a nanogap is formed between the upper electrode and the lower electrode; and
   g) adsorbing conductive organic molecules between the upper electrode and the lower electrode,
   wherein the sacrificial layer pattern is formed of an organic material, an oxide film, a metal film, or a combination thereof having different etching selection ratios with respect to the insulating layer, the sacrificial layer pattern is formed in a nanometer thickness and the nano gap is formed with vertical and horizontal distances between the upper and lower electrodes wherein the horizontal distances are larger than the vertical distance.

2. The method according to claim 1, the sacrificial layer is formed of Ti, Pt or Au.

3. A method for manufacturing an organic molecular device comprising the steps of:
   a) providing a substrate of a resistive insulating material having an insulating layer formed on an upper surface and forming a lower electrode on the insulating layer;
   b) forming a predetermined size of a sacrificial layer pattern on an entire upper surface of the substrate including the lower electrode and the insulating layer;
   c) using a photo etching technique to remove a portion of the sacrificial layer excluding a predetermined area covering the lower electrode so that the sacrificial layer surrounds the lower electrode;
   d) covering the entire remaining surface from step c) including the sacrificial layer surrounding the lower electrode with a polymer and forming a polymer pattern with a line width of 50 nm by an electron beam etching technique to expose the sacrificial layer and the substrate on which the lower electrode is formed;
   e) forming an upper electrode by depositing metal on an entire upper surface from step d) and removing metal on the polymer pattern by a lift-off process so that an upper electrode is formed on the sacrificial layer so as to have an air-bridge configuration and to surround upper and side surfaces of the lower electrode and to be on an exposed portion of the insulating layer;
   f) removing the sacrificial layer so that a nanogap is formed between the upper electrode and the lower electrode; and
   g) adsorbing conductive organic molecules between the upper electrode and the lower electrode,
   wherein the nanogap is formed with vertical and horizontal distances between the upper and lower electrodes, wherein the horizontal distances are larger than the vertical distance and wherein the conductive organic molecules are adsorbed while the substrate is immersed in a solution containing the conductive organic molecules.

4. The method according to claim 3, wherein an electric field is applied between the lower electrode and the upper electrode on the substrate.

5. The method according to claim 3, wherein the solution is stirred or heated.

6. The method according to claim 3, the sacrificial layer is formed of Ti, Pt or Au.

7. A method for manufacturing an organic molecular device comprising the steps of:
   a) providing a substrate of a resistive insulating material having an insulating layer formed on an upper surface and forming a lower electrode on the insulating layer;
   b) forming a predetermined size of a sacrificial layer pattern on an entire upper surface of the substrate including the lower electrode and the insulating layer;
   c) using a photo etching technique to remove a portion of the sacrificial layer excluding a predetermined area covering the lower electrode so that the sacrificial layer surrounds the lower electrode;
   d) covering the entire remaining surface from step c) including the sacrificial layer surrounding the lower electrode with a polymer and forming a polymer pattern with a line width of 50 nm by an electron beam etching technique to expose the sacrificial layer and the insulating layer on which the lower electrode is formed;
   e) forming an upper electrode by depositing metal on an entire upper surface from step d) and removing metal on the polymer pattern by a lift-off process so that an upper electrode is formed so as to have an air-bridge configuration and to surround upper and side surfaces of the lower electrode and to be on an exposed portion of the insulating layer;
   f) removing the sacrificial layer so that a nanogap is formed between the upper electrode and the lower electrode; and
   g) adsorbing conductive organic molecules between the upper electrode and the lower electrode,
   wherein the nanogap is formed with vertical and horizontal distances between the upper and lower electrodes, wherein the horizontal distances are larger than the vertical distance, and wherein a current flowing through the lower electrode and the upper electrode is sensed to determine the amount of the conductive organic molecules that is absorbed.

8. The method according to claim 7, further comprising a step of passivating an exterior with an insulating film after the step e).

9. The method according to claim 7, the sacrificial layer is formed of Ti, Pt or Au.

* * * * *